(12) United States Patent
Petrov et al.

(10) Patent No.: US 6,744,309 B1
(45) Date of Patent: Jun. 1, 2004

(54) ABSOLUTE VALUE AMPLITUDE BASEBAND DETECTOR

(75) Inventors: Andrei R. Petrov, Pocatello, ID (US); Craig L. Christensen, Pocatello, ID (US)

(73) Assignee: AMI Semiconductor, Inc., Pocatello, ID (US)

(*) Notice: Subject to any disclaimer, the term of this patent is extended or adjusted under 35 U.S.C. 154(b) by 0 days.

(21) Appl. No.: 10/262,437

(22) Filed: Sep. 30, 2002

(51) Int. Cl.[7] .............................. H03D 1/00; H04L 27/06
(52) U.S. Cl. ........................ 329/347; 329/358; 375/320
(58) Field of Search .................. 329/304–311, 323–326, 329/345–347, 358–362; 375/320, 322, 324, 325, 329, 334, 340, 345

(56) References Cited

U.S. PATENT DOCUMENTS

| | | | |
|---|---|---|---|
| 3,808,376 A | * 4/1974 | Melvin | 179/15 R |
| 4,146,843 A | 3/1979 | Isobe | 329/50 |
| 4,234,963 A | 11/1980 | Hongu et al. | 455/204 |
| 4,307,347 A | 12/1981 | Thomson | 329/50 |
| 4,942,365 A | 7/1990 | Satterwhite | 328/134 |
| 5,015,963 A | 5/1991 | Sutton | 329/361 |
| 5,467,399 A | 11/1995 | Whitecar | 381/4 |

* cited by examiner

Primary Examiner—David Mis
(74) Attorney, Agent, or Firm—Workman Nydegger (57) ABSTRACT

Amplitude detection of a baseband electrical signal. The detection may be performed by performing full wave rectification on both an in-phase portion of the electrical signal, as on a quadrature-phase portion of the electrical signal. The output signal may be generated by summing the rectified in-phases signal and the rectified quadrature-phase signal. The peak amplitude of the output signal may then be used to determine the amplitude of the original baseband signal.

23 Claims, 10 Drawing Sheets

ABSOLUTE VALUE AMPLITUDE BASEBAND DETECTOR

BACKGROUND OF THE INVENTION

1. The Field of the Invention

The present invention relates to wireless radio receiver technology and, more specifically, to improved circuits and methods for the detection of the amplitude of baseband signals.

2. Background and Related Art

Electrical signals have proven to be an effective means of conveying data from one location to another. However, for any given transmission medium, the further a signal is transmitted, the greater the decay in the signal and the greater the chance for irreversible loss in the data represented by the signal. In order to guard against this signal decay, the core electrical signal that represents the data (i.e., the baseband signal) may often be modulated or superimposed on a carrier wave in the Radio Frequency (RF) frequency spectrum.

If the baseband signal has been modulated, then RF receivers demodulate the baseband signal from the modulated signal. Regardless of whether or not the baseband signal was modulated on a carrier signal, the data represented by the baseband signal may then be interpreted by other downstream circuitry. In order to extract the data from the baseband signal, it often necessary to determine an amplitude of the baseband signal at particular sampling times. For example, such amplitude detection is important when the baseband signal is encoded using Amplitude Shift Keyed (ASK) encoding, On-Off Keyed (OOK) encoding, or another amplitude-based encoding technique.

One important parameter for amplitude baseband detection is called "dynamic range", which is the ratio of the highest detectable amplitude in decibels to the lowest detectable amplitude in decibels. A higher dynamic range is desirable since a greater range of amplitudes are detectable.

Another important parameter in amplitude detection is whether detection is performed on baseband signals that are required to be synchronously demodulated, or whether detection is performed on baseband signals that are required to be asynchronously demodulated. Synchronous demodulation means that the locally produced oscillation used to perform demodulation must be synchronized with the frequency of the carrier wave upon which the baseband signal is modulated. Such synchronization typically requires additional circuitry as compared to not having such synchronization.

Accordingly, what is desired are methods and circuits for performing amplitude detection with a high dynamic range and without regard for whether demodulation is synchronous or asynchronous.

SUMMARY OF THE INVENTION

In accordance with the present invention, methods and circuits for detecting the amplitude of an electrical signal such as a baseband electrical signal are described. The amplitude detection may be performed by performing full wave rectification on both an in-phase portion of the electrical signal, as well as on a quadrature-phase portion of the electrical signal. An output signal is then generated that is approximately proportional to the sum of the two rectified signals. For example, the output signal may be generated by summing the rectified in-phase signal and the rectified quadrature-phase signal.

In one example, the full wave rectification on the in-phase portion of the electrical signal is performed by a waveform sharpener in concert with a commutating mixer and a subtracting amplifier. The waveform sharpener generates control signals in the form of square waves. One control signal is high when the corresponding in-phase portion of the electrical signal is high, and low when the corresponding in-phase portion of the electrical signal is low. Another control signal is high when the corresponding in-phase portion of the electrical signal is low, and low when the corresponding in-phase portion of the electrical signal is high.

The commutating mixer receives and is controlled by the control signals such that the commutating mixer passes the high portion and low portions of the electrical signals to the positive and negative terminals of the subtracting amplifier at appropriate times such that the subtracting amplifier generates a signal that represents a fill wave rectification of the in-phase portion of the electrical signal. Similar full wave rectification may occur in the quadrature-phase portion of the electrical signal.

The output signal may then be used to determine the amplitude of the input electrical signal. For example, the peak amplitude of the output signal will be proportional to the amplitude of the originally input signal. For example, if the baseband electrical signal is encoded using Amplitude Shift Keying (hereinafter also referred to as "ASK") or On-Off, Shift Keying (hereinafter also referred to as "OOK") encoding techniques, the peak amplitude of the output signal generated by the amplitude detection circuit is relevant in identifying data represented by the signal. However, the amplitude information may also be relevant for other applications as well.

The method and circuit for amplitude detection have a number of advantages including a high dynamic range and the ability to function regardless of whether the baseband electrical signal is synchronously or asynchronously modulated. The circuit for amplitude detection described below also has a small time constant or delay, and may be constructed using current integrated circuit fabrication processes.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 3B illustrates an example of the down converted in-phase portion of the

DETAILED DESCRIPTION OF THE INVENTION

The present invention relates to methods and circuits for detecting the amplitude of an electrical signal such as a baseband electrical signal. The detection may be performed by performing fill wave rectification on both an in-phase portion of the electrical signal, as well as on a quadrature-phase portion of the electrical signal. An output signal is then generated that is proportional to the sum of the two rectified signals. For example, the output signal may be generated by summing the rectified in-phases signal and the rectified quadrature-phase signal.

Figure 1:
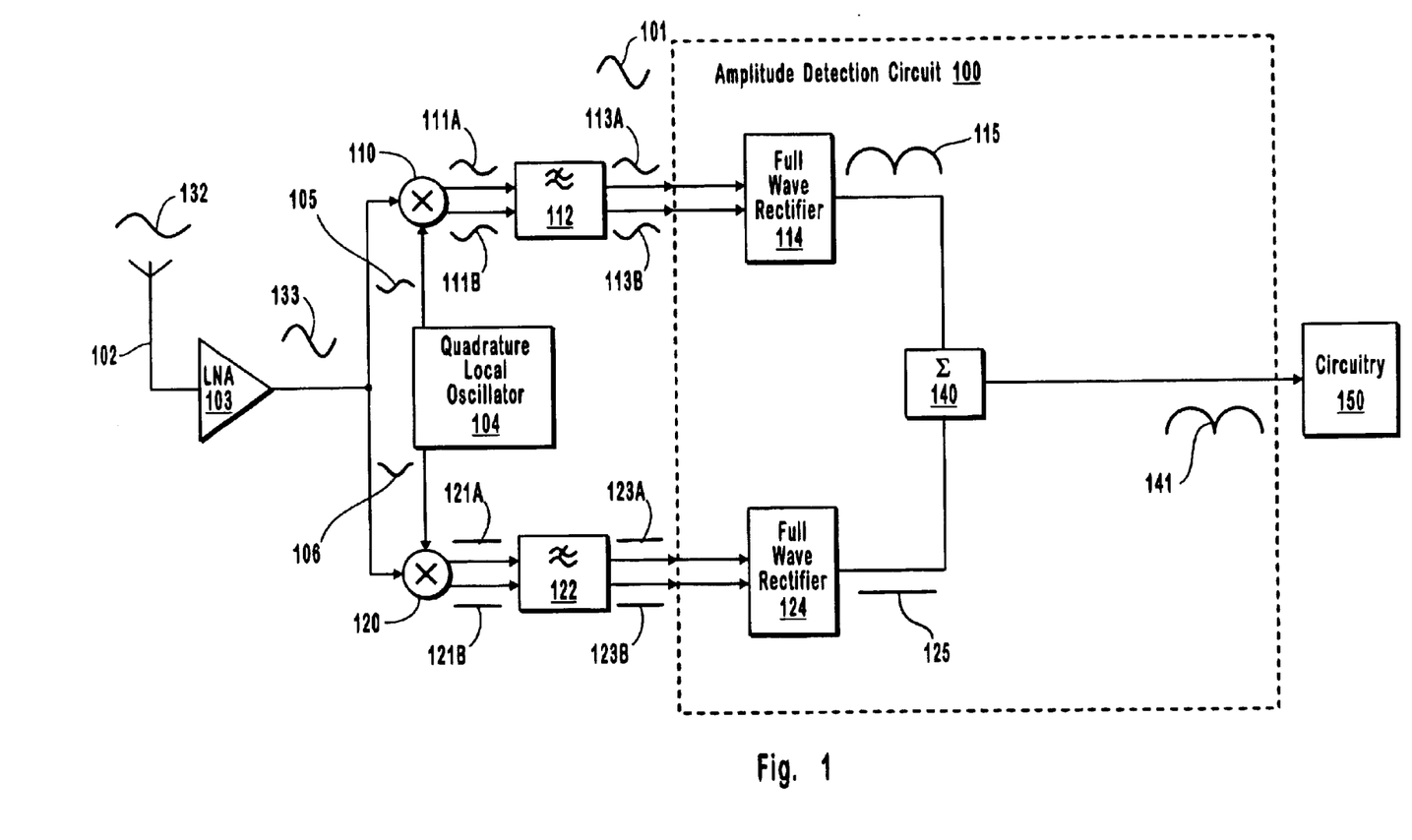
FIG. 1 schematically illustrates a general embodiment of an amplitude detection circuit along with several symbolic waveforms in accordance with the principles of the present invention.
Figure 3A:
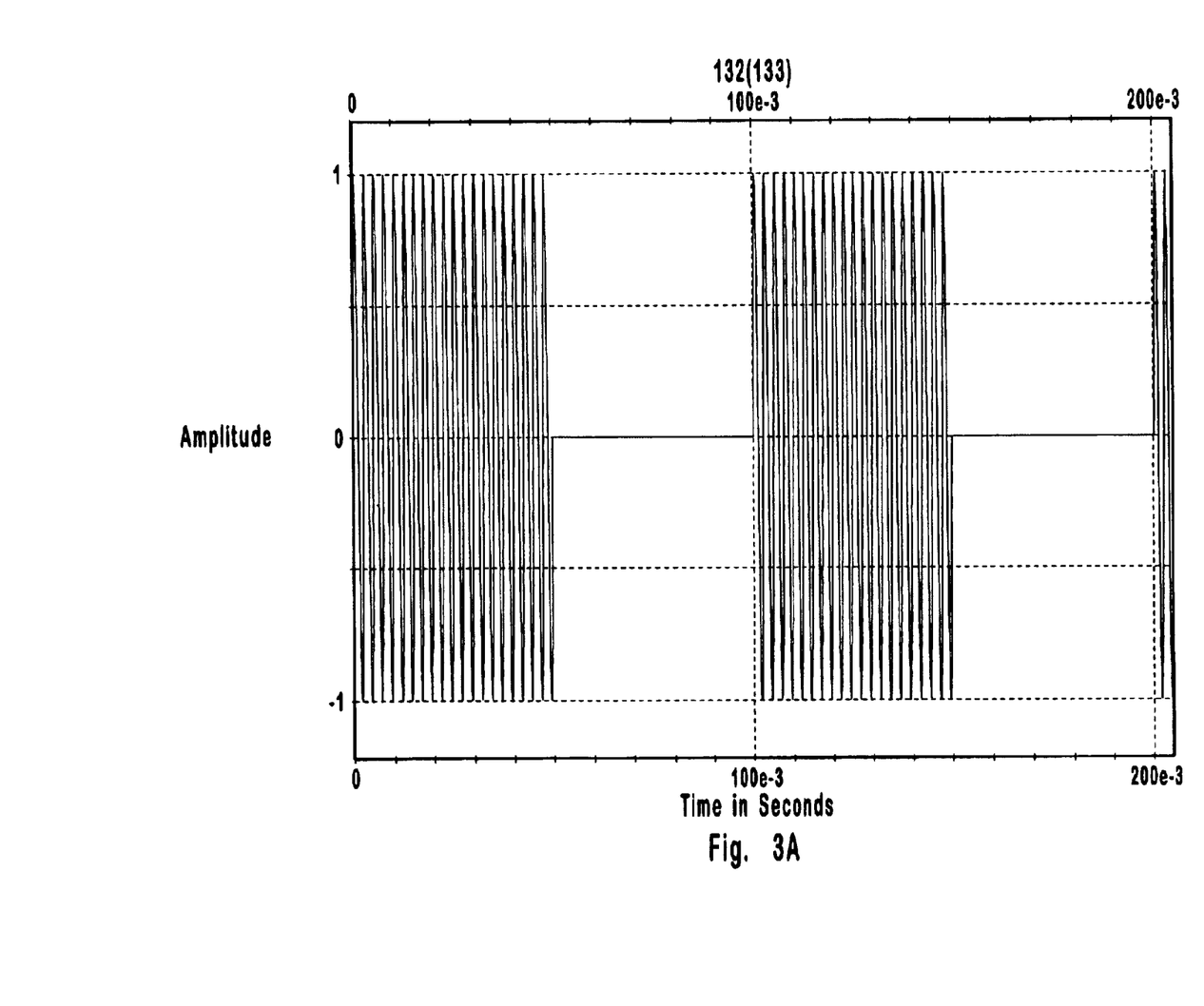
FIG. 3A illustrates an example of the received carrier signal from which the baseband signal is to be demodulated.

FIG. 1 illustrates an amplitude detection circuit 100 in accordance with the present invention. The amplitude detection circuit 100 assists in detecting the amplitude of a signal 101. In one embodiment, the signal 101 is a baseband signal that was demodulated from a carrier signal 132 that was wirelessly received using antenna 102. The received signal 132 may be passed through a low-noise amplifier 103 to generate amplified signal 133. FIG. 3A illustrates a waveform that represents the general shape of an example signal. In all of the waveform diagrams of FIG. 3A through FIG. 3F, the horizontal axis represents time in seconds, and the y-axis represents relative amplitude.

Figure 3B:
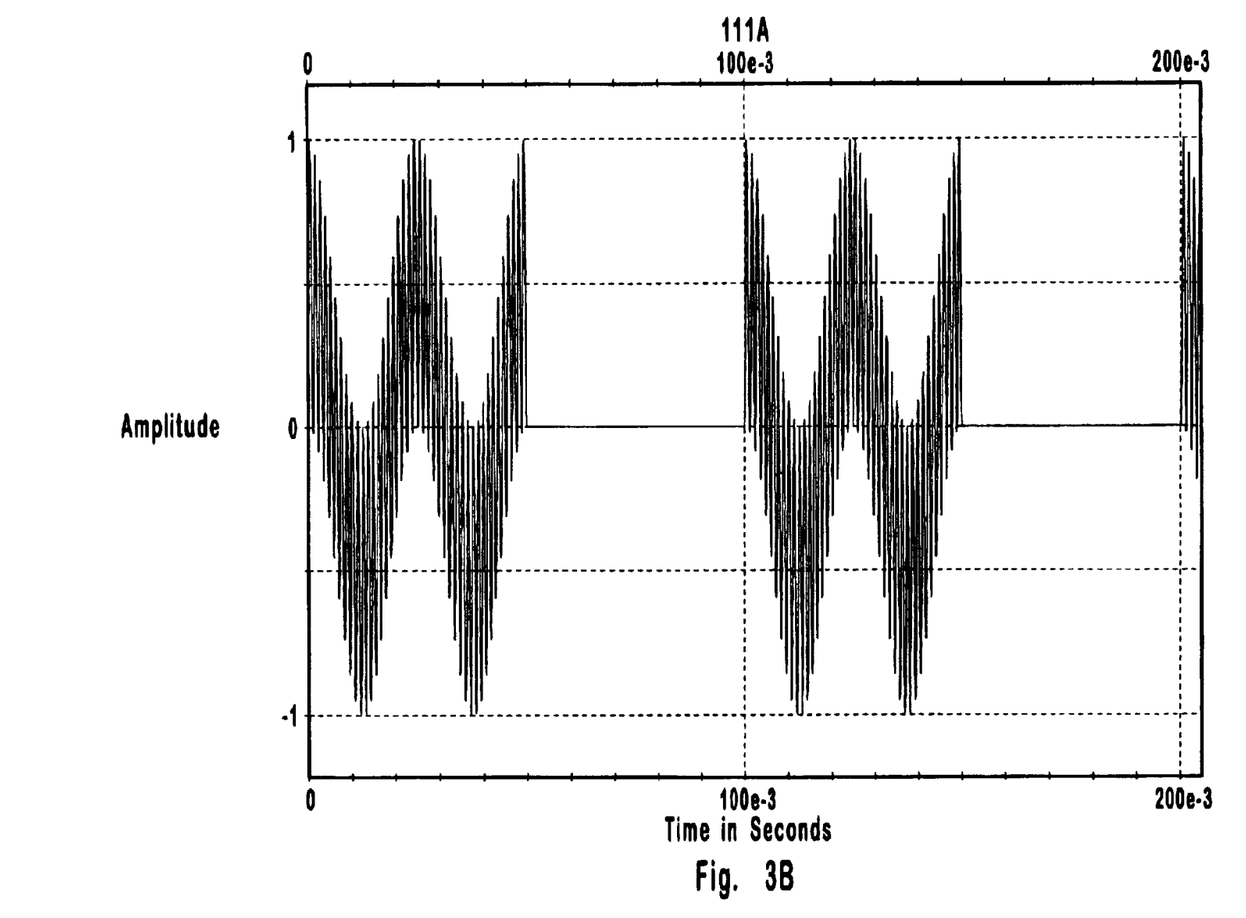

Once amplified, the amplified signal 133 is provided to an in-phase mixer 110 to generate an in-phase signal 111A. The in-phase mixer 110 also generates an inverted in-phase signal 111B that is inverted about an offset voltage as compared to the in-phase signal 111A. In one example, the offset voltage may be selected so that the magnitude of the in-phase signal 111A is sometimes above the offset voltage, and sometimes below the offset voltage. FIG. 3B illustrates a waveform of an in-phase signal 111A that results by performing such mixing upon the amplified signal 133 illustrated in FIG. 3A. The in-phase signal 111A is illustrated as having a maximum at a value of one, and a minimum value of minus one, with a central value of zero. The offset voltage may be half of Vdd, in which case the zero amplitude point of the vertical axis in FIG. 3B would correspond to a voltage level of half of Vdd.

Figure 3C:
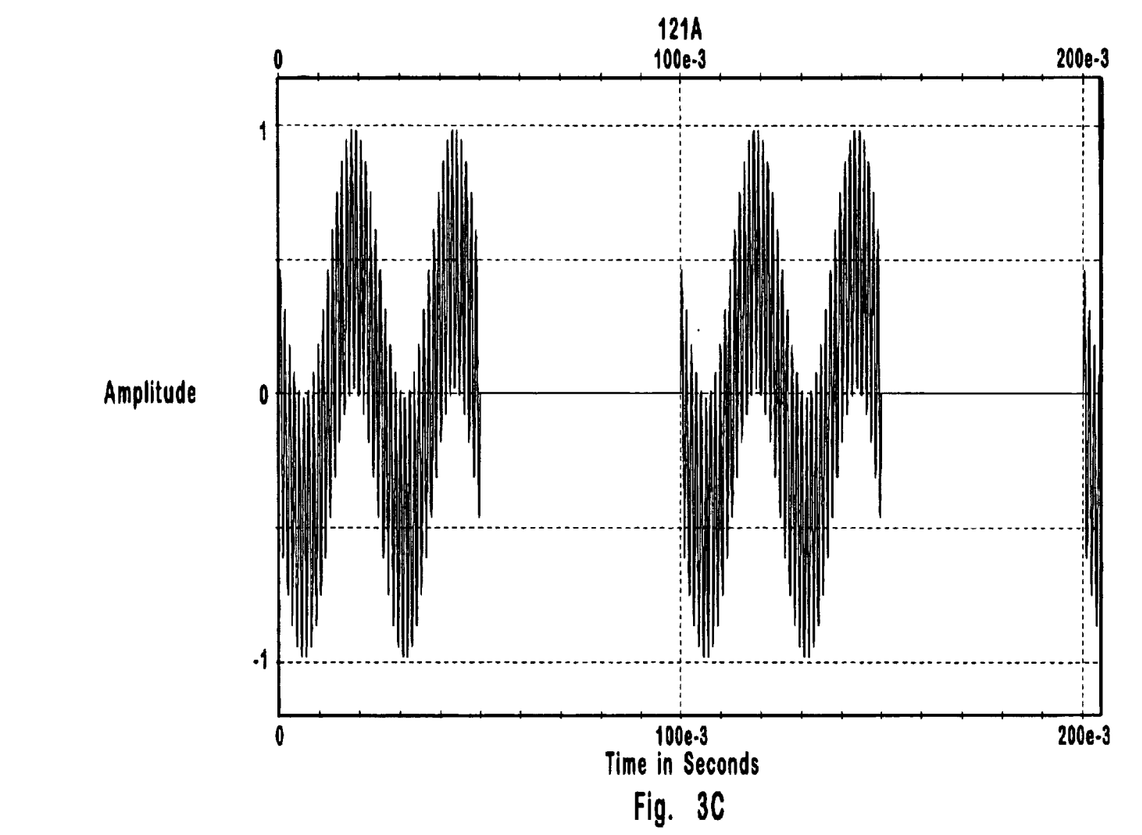
FIG. 3C illustrates an example of the down converted quadrature-phase portion of the signal.

The amplified signal 133 is also provided to a quadrature-phase mixer 120 to generate a quadrature-phase signal 121A. FIG. 3C illustrates an example of the quadrature-phase signal 121A generated when the quadrature-phase mixer 120 is provided with the amplified signal 133. The quadrature-phase mixer 120 also generates an inverted quadrature-phase signal 121B that is inverted about a predetermined offset voltage as compared to the quadrature-phase signal 121A. Once again, the offset voltage may be selected so that the magnitude of the quadrature-phase signal 121A of the signal 101 is sometimes above the offset voltage, and sometimes below the offset voltage. For example, the offset voltage may be the same as the offset voltage used for the in-phase mixer 110.

The in-phase signal 111A may be generated by multiplying the amplified signal 133 by a first repeating waveform 105 (such as a simple repeating sine wave) of approximately the same frequency as the amplified signal 133, while the quadrature-phase signal 121A may be generated by multiplying the amplified signal 133 by a second repeating waveform 106 (such as a simple repeating cosine wave) that is approximately the same as the first repeating waveform, except being ninety degrees out of phase from the first repeating waveform. An oscillator 104 is provided to generate the repeating sine and cosine waveforms.

Sometimes the frequency of the repeating waveform that is multiplied against the amplified signal 133 is the same as the frequency of the signal. When this is the case, the amplitude detection is considered "synchronous". However, when the frequencies are not the same, one can expect some "frequency roll"; meaning that over time, the in-phase signal 111A will migrate towards and become the quadrature-phase signal 121A, an vice versa. In the latter case, the amplitude detection is considered "asynchronous". One of the advantages of the present invention is that it performs accurate amplitude detection, whether or not there is frequency roll. Accordingly, the principles of the present invention are suitable for both synchronous amplitude detection and asynchronous amplitude detection.

Figure 3D:
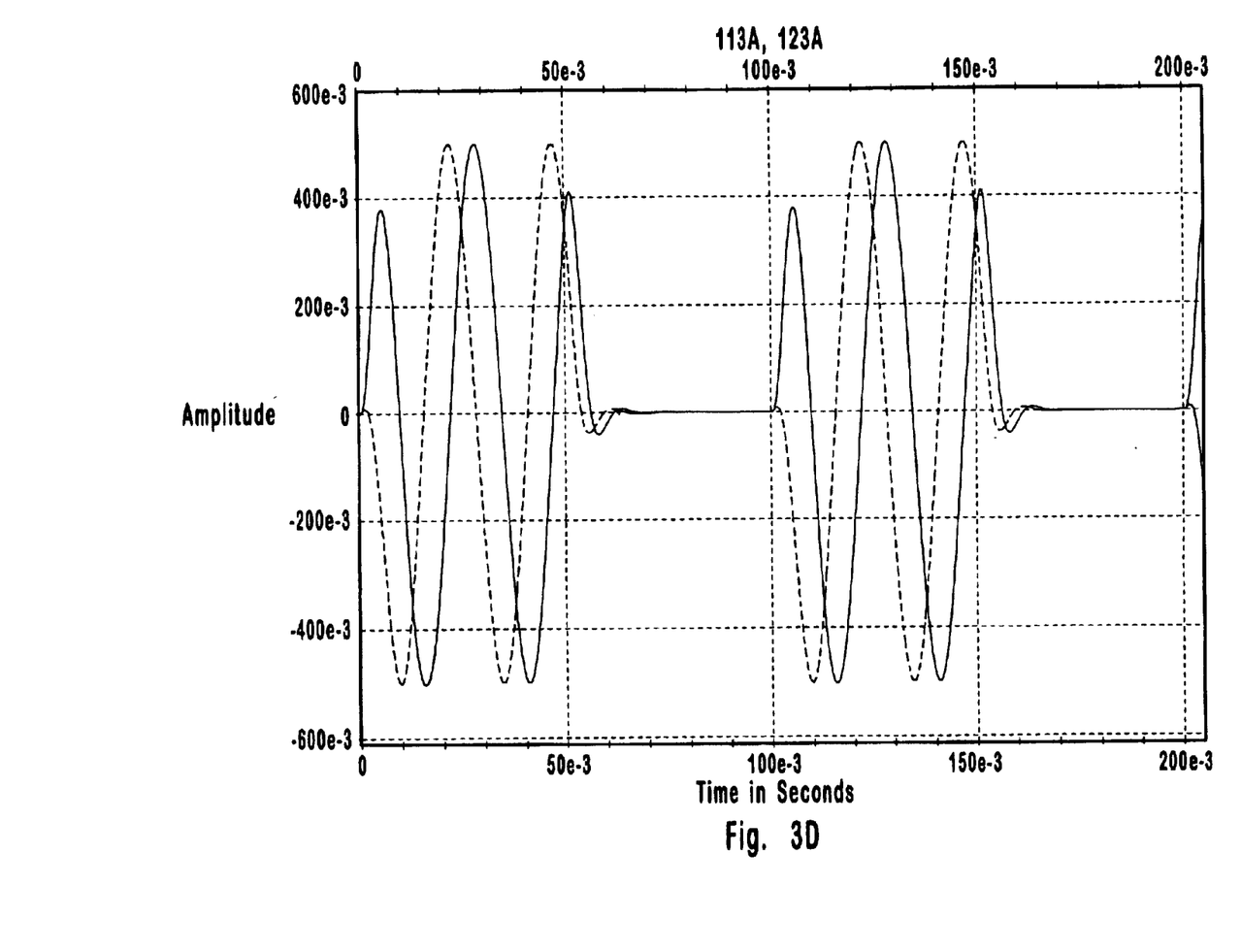
FIG. 3D illustrates the baseband in-phase signal and the quadrature-phase signal after passing through a low pass filter.

The in-phase signal 111A and the inverted in-phase signal 111B may be passed through a low-pass filter 112, while the quadrature-phase signal 121A and the inverted quadrature-phase signal 121B are passed through a low-pass filter 122. The result is filtered in-phase signal 113A, filtered inverted in-phase signal 113B, filtered quadrature-phase signal 123A, and filtered inverted quadrature-phase signal 123B, which combined represent a baseband signal 101 as is know to those of ordinary skill in the art. FIG. 3D illustrates an example of waveform 113A (illustrated with a solid line) that may be generated by passing a non-synchronously downconverted in-phase signal 111A illustrated in FIG. 3B through the low-pass filter 112. FIG. 3D also illustrates an example of waveform 123A (illustrated with a dashed line) that may be generated by passing a non-synchronously downconverted quadrature-phase portion 121A of the electrical signal 133 through the low-pass filter 122. The process of extracting the baseband signal 101 (and its components 113A, 113B, 123A and 123B) from a carrier signal 132 is known to those of ordinary skill in the art. The unique and advantageous aspect of the invention resides in how the amplitude of the signal 101 is measured.

Figure 3E:
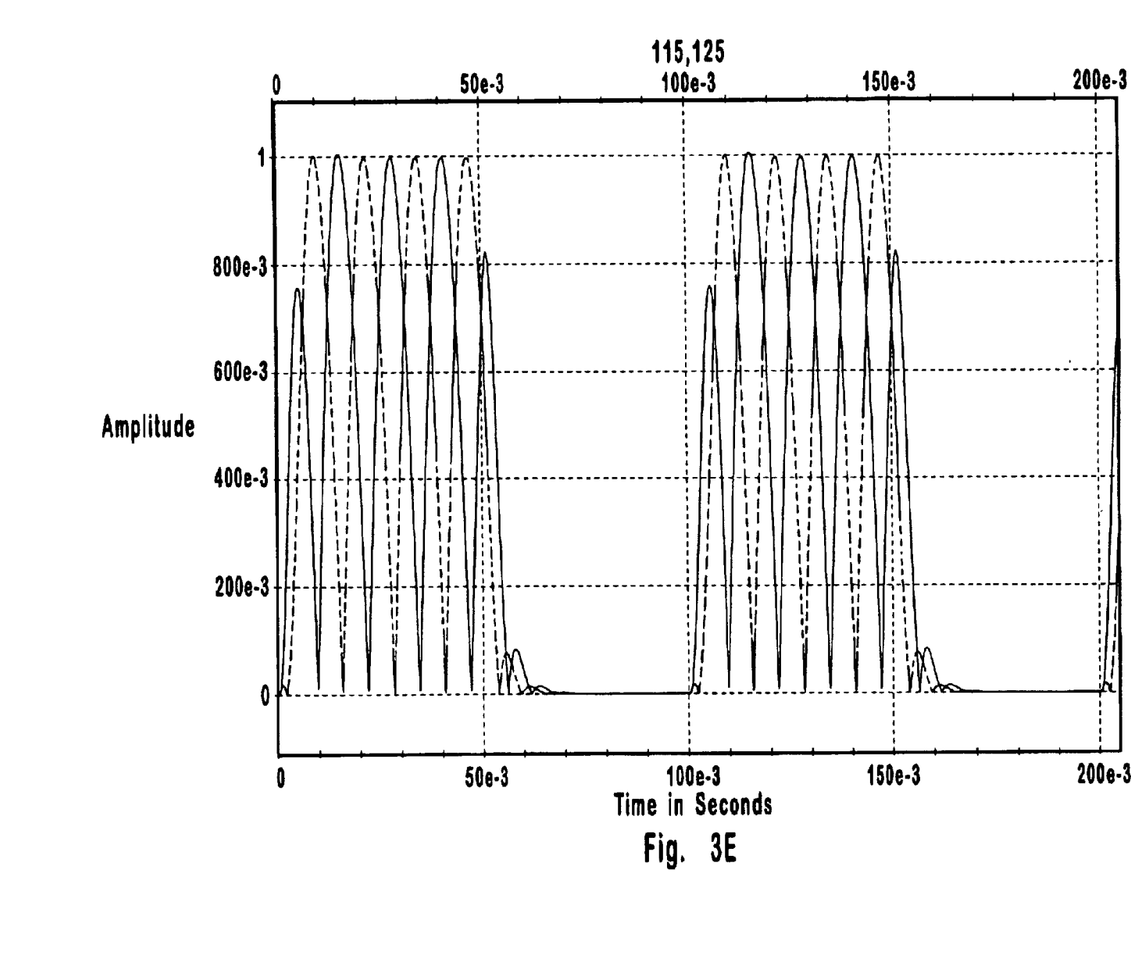
FIG. 3E illustrates the filtered baseband in-phase and quadrature-phase signals after undergoing full-wave rectification.

The amplitude detection circuit 100 includes a first full wave rectifier 114 which uses the filtered in-phase signal 113A and the filtered inverted in-phase signal 113B to perform full wave rectification on the in-phase signal 113A to generate a first rectified signal 115. The first full wave rectifier may also be referred to in this description as an "in-phase" full wave rectifier since it operates on the filtered in-phase signal 113A of the signal 101. The filtered quadrature-phase signal 123A is full wave rectified using a second full wave rectifier 124 to generate a second rectified signal 125. The second full wave rectifier may also be referred to in this description as a "quadrature-phase" full wave rectifier since it operates on the filtered quadrature-phase signal 123A. "Full wave rectification" refers to the rectification (with potential amplification) of a signal about a specific offset voltage, which may be zero or ground, or may be a non-zero voltage. As will be described below, specific values for the offset voltage allow for high dynamic range of the amplitude detection circuit. FIG. 3E illustrates an example of waveform 115 (illustrated with a solid line) that may be generated by performing full wave rectification of a non-synchronously downconverted in-phase signal 113A illustrated in FIG. 3D, and illustrates an example of waveform 125 (illustrated with a dashed line) that may be generated by performing full wave rectification of a non-synchronously downconverted quadrature-phase signal 123A illustrated in FIG. 3D.

Figure 3F:
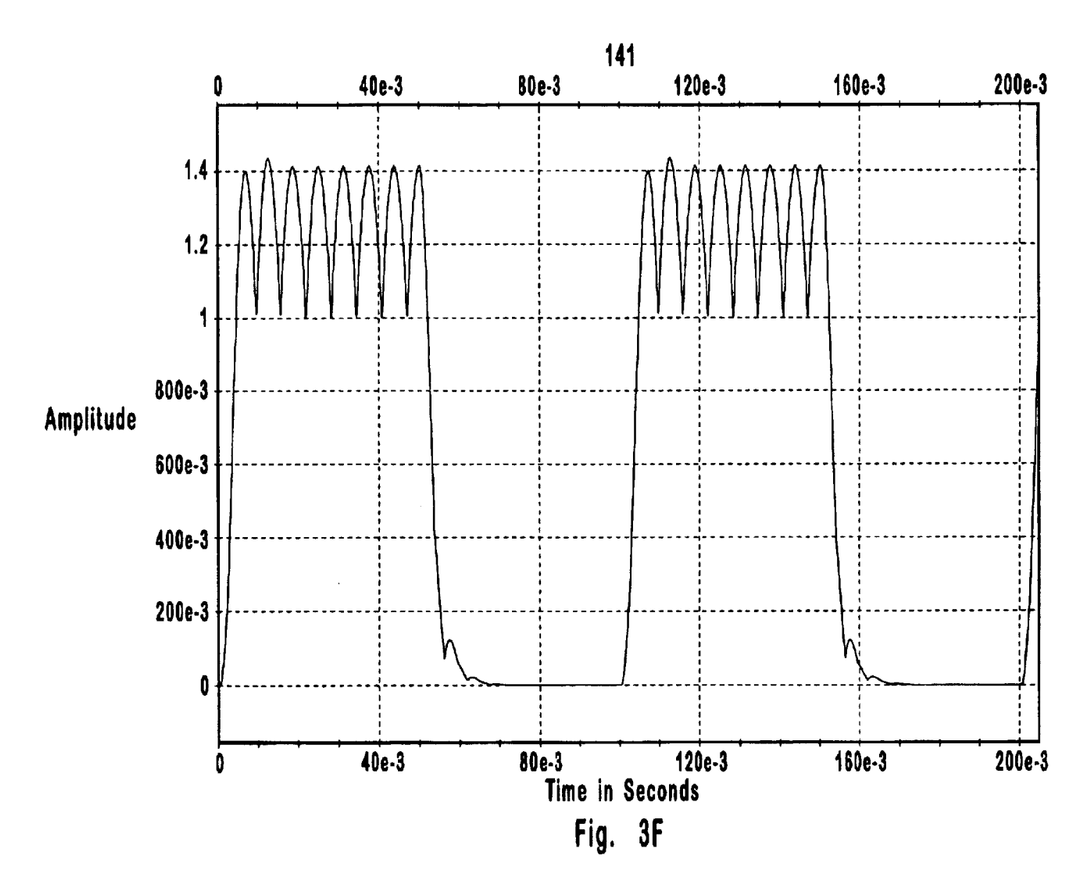
FIG. 3F illustrates a signal that represents the sum of the two full-wave rectified baseband signals.

The first rectified signal 115 and the second rectified signal 125 are then provided to a summer 140, which generates an output signal 141, which may then be used to determine the amplitude of the signal 101 using downstream circuitry 150. FIG. 3F illustrates an example of waveform 141 that may be generated by summing the examples of waveforms 115 and 125 illustrated in FIG. 3E.

Figure 2:
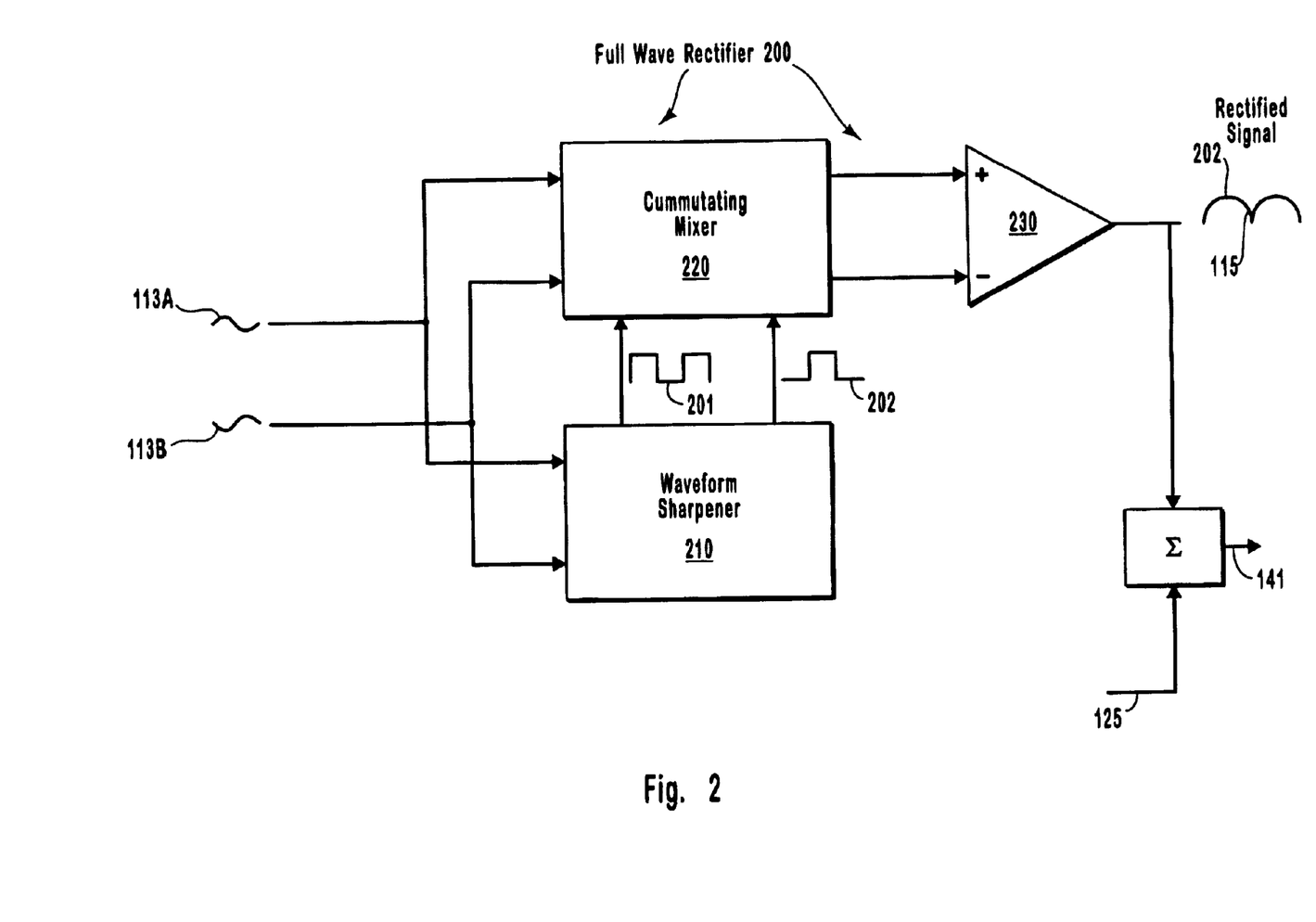
FIG. 2 schematically illustrates a general embodiment of a fill wave rectifier along with several relevant example waveforms in accordance with the principles of the present invention.

FIG. 2 shows a full wave-rectifier 200 that represents an example of the first full wave rectifier 114, and also represents an example of the second full wave rectifier 124. The fill wave rectifier 200 includes a waveform sharpener 210, a commutating mixer 220, and a subtraction amplifier 230. While the full wave rectifier 200 is described herein with respect to the in-phase signals 113A and 113B, the full wave rectifier 200 may also perform the same actions to the quadrature-phase signals 123A and 123B. The waveform sharpener 210 generates control signals 201 and 202 that force the commutating mixer 220 and subtracting amplifier 230 to rectify and amplify the in-phase signal 113A.

Figure 4:
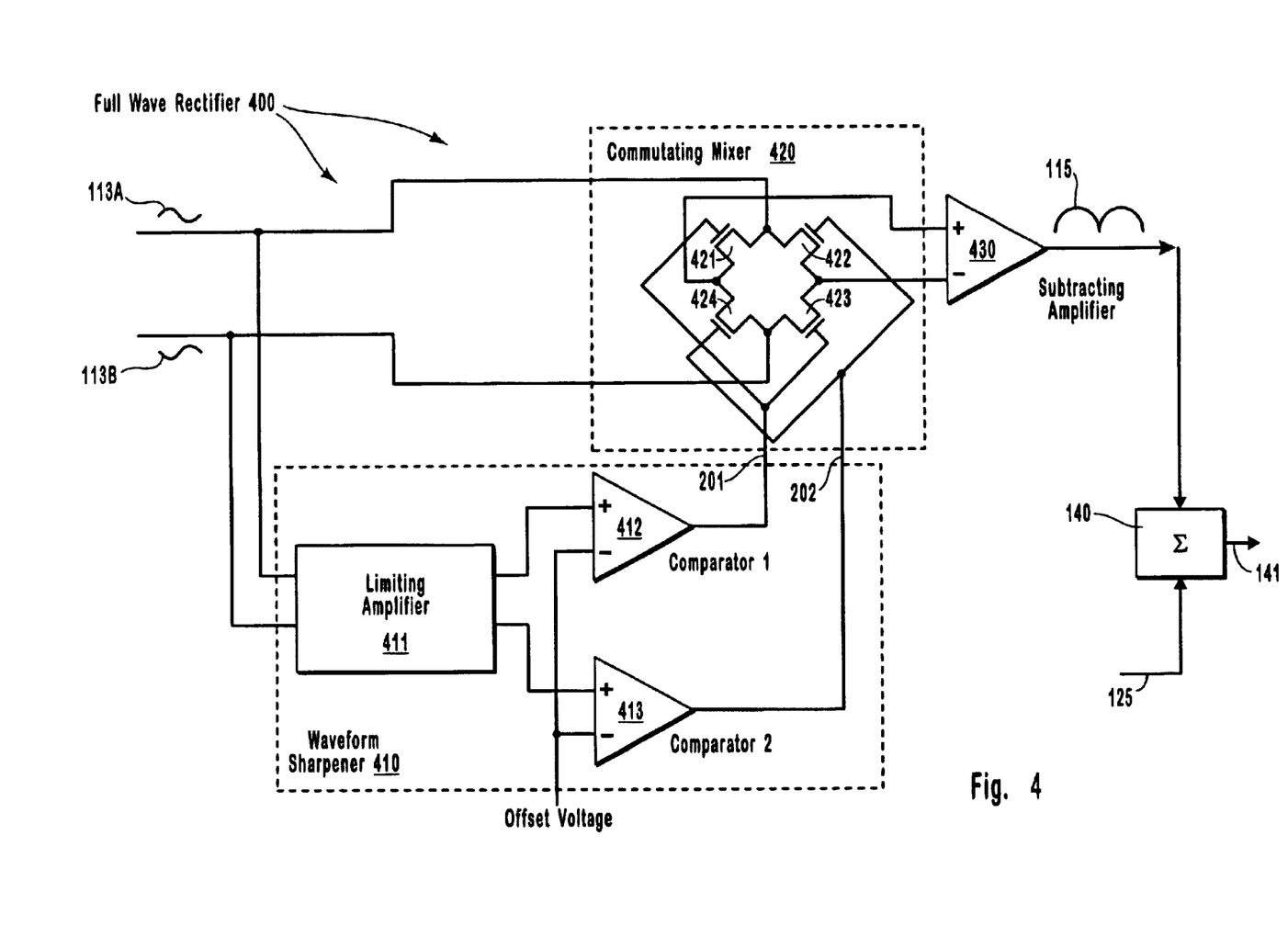
FIG. 4 illustrates a more specific example of a full wave rectifier in accordance with the principles of the present invention.

FIG. 4 is a more specific embodiment of a full wave rectifier 400 that represents one example of the full wave rectifier 200 of FIG. 2. The waveform sharpener 410 and the commutating mixer 420 respectively represent examples of the waveform sharpener 210 and the commutating mixer 220 of FIG. 2. The full wave rectifier 400 operates to perform full wave rectification of the filtered in-phase signal about a predetermined offset voltage.

The waveform sharpener 410 receives the differential input signals 113A and 113B and then amplifies the signals using limiting amplifier 411. With smaller amplitudes, the differential sine wave input would produce a signal close to a square wave, only with rounded corners. With higher amplitudes, the differential sine wave would produce a signal even closer to a square wave, with less prominent (or even unnoticeable) rounded corners. The signals generated by the limiting amplifier may be referred to in this description and the claims as a "pseudo square wave". The pseudo square wave generated from the signal 113A is fed to the positive input terminal of the comparator 412, while the differential pseudo square wave generated from the differential signal 113B is fed to the positive input terminal of the comparator 413. The negative terminals of each of the comparators 412 and 413 are held at an offset voltage about which voltage rectification is to occur. The offset voltage level equals the DC voltage level at the limiting amplifier 411 outputs plus the threshold voltage, which depends on signal to noise ratio at the limiting amplifier 411 differential output.

The output of the comparator 412 is represented as signal 201 in FIG. 2 and FIG. 4. Signal 201 is a square wave that is high when the signal 113A is above the offset voltage, and low when the signal 113A is below the offset voltage. The output of the comparator 413 is represented as signal 202 in FIG. 2 and FIG. 4. Signal 202 is almost the complement of signal 201. In other words, signal 202 is high when the signal 113B is above the offset voltage, and low when the signal 113B is below the offset voltage.

The commutating mixer 420 includes four nMOS transistors 421, 422, 423 and 424. The nMOS transistors 421 and 423 each have gate terminals coupled to the output terminal of the comparator 412. Accordingly, signal 201 represents the gate voltage of nMOS transistors 421 and 423 during operation. The nMOS transistors 422 and 424 each have gate terminals coupled to the output terminal of the comparator 413. Accordingly, signal 202 represents the gate voltage of nMOS transistor 422 and 424 during operation.

When the transistor 421 is on (i.e., when the signal 201 is high and when the signal 113A is above the offset voltage), transistor 421 couples the input signal 113A to the positive terminal of the subtracting amplifier 430. When the transistor 422 is on (i.e., when the signal 202 is high and when the signal 113A is below the offset voltage), transistor 422 couples the input signal 113A to the negative terminal of the subtracting amplifier 430. When the transistor 423 is on (i.e., when the signal 201 is high and when the signal 113B is below the offset voltage), transistor 423 couples the differential input signal 113B to the negative terminal of the subtracting amplifier 430. When the transistor 424 is on (i.e., when the signal 202 is high and when the signal 113B is above the threshold voltage), transistor 424 couples the input signal 113B to the positive terminal of the subtracting amplifier 430.

In other words, when the signal 201 is high, the above offset portion of the input signal 113A is coupled to the positive terminal of the subtracting amplifier 430, whereas the below offset portion of the input signal 113B is coupled to the negative terminal of the subtracting amplifier 430. Accordingly, when the signal 201 is high, the subtracting amplifier 430 generates a signal that is proportional to the above offset portion of the input signal 113A. Also, when the signal 202 is high, the below offset portion of the input signal 113A is coupled to the negative terminal of the subtracting amplifier 430, whereas the above offset portion of the input signal 113B is coupled to the positive terminal of the subtracting amplifier 430. Accordingly, when the signal 202 is high, the subtracting amplifier 430 generates a signal that is proportional to the above threshold portion of the input signal 113B. In this manner, full wave rectification may be accomplished in accordance with the principles of the present invention.

In order to achieve a high dynamic range in this embodiment, the Direct Current (DC) offsets should both be approximately equal to half of the high supply voltage Vdd minus the transistor threshold voltage Vt times the offset voltage, where the offset voltage is equal to the offset voltage about which full wave rectification occurs. In this case, the dynamic range of the amplifier detection circuit would be well over 100 decibels.

Figure 5:
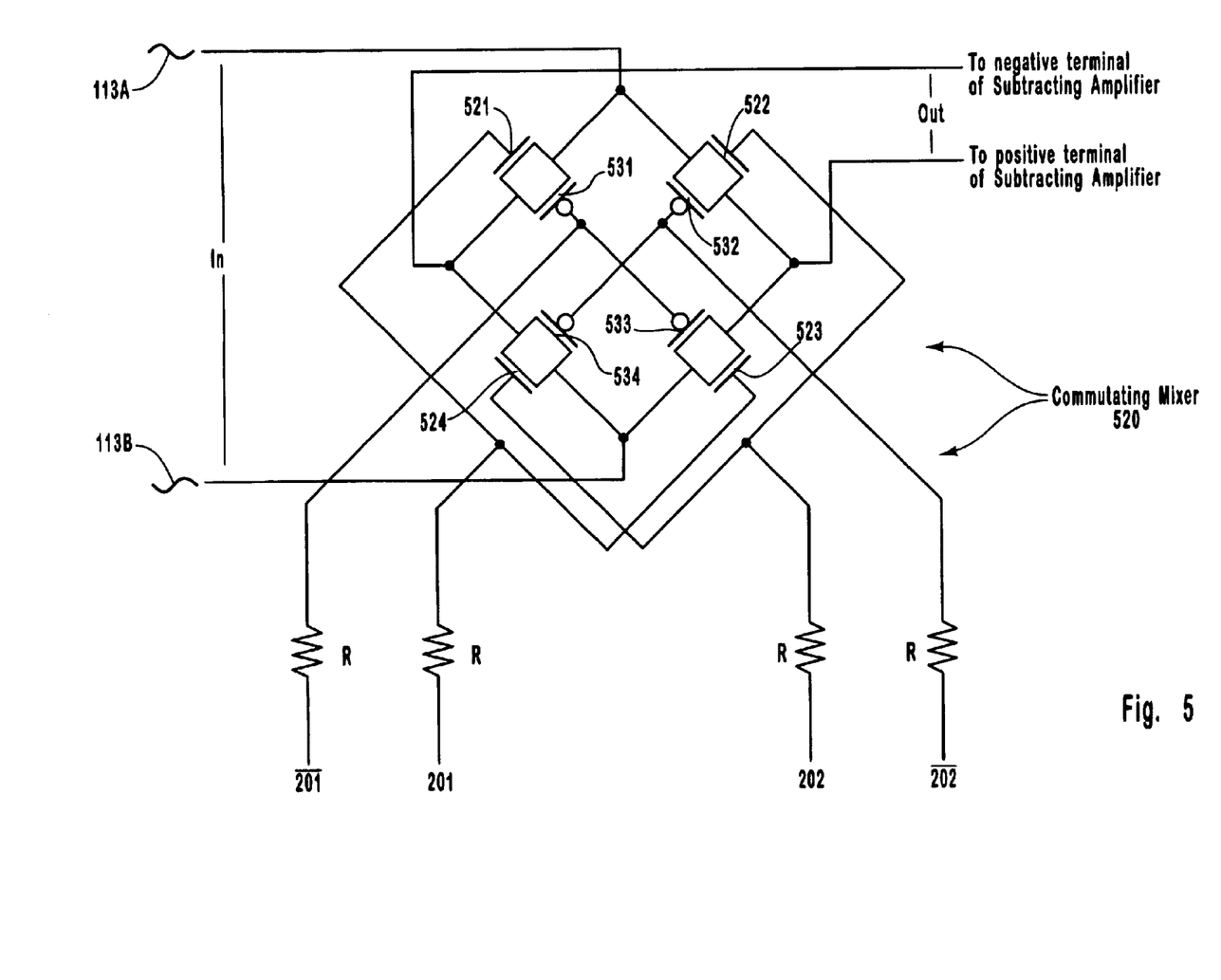
FIG. 5 illustrates another specific example of a full wave rectifier that reduces charge injection in accordance with the principles of the present invention.

FIG. 5 illustrates a commutating mixer 520 that represents another example of the commutating mixer 220 of FIG. 2. The commutating mixer 520 is similar to the commutating mixer 420 of FIG. 4 as it includes four nMOS transistors 521 through 524 that have similar configurations as described above for nMOS transistors 421 through 424, respectively.

However, pMOS transistors 531, 532, 533, and 534 are also coupled between the same nodes as nMOS transistors 521, 522, 523 and 524, respectively. Each of pMOS transistors 531, 532, 533 and 534 has a voltage applied at its gate that is the complement of the voltage applied at the gate terminal of corresponding nMOS transistors 521, 522, 523 and 524. Although the commutating mixer 400 possibly requires the generation of two additional gate terminal voltages, charge injection is better suppressed and switch impedance is decreased as compared to the commutating mixer 420 of FIG. 4. In order to have a high dynamic range once again well above 100 decibels, the direct current offsets of the input signals 113A and 113B as well as the output terminals to the subtracting amplifier should be approximately equal to half of the supply voltage Vdd.

Returning to FIG. 1, note that the rectified signal 115 and 125 are added using signal summer 140. Accordingly, the local oscillator need not be synchronized with the frequency of the modulation frequency of the carrier signal 131. For example, consider a case in which there is frequency roll. Suppose that the in-phase signal 113A initially represents exactly the signal 101, while the quadrature-phase signal 123A is substantially flat. With frequency roll, the amplitude of the in-phase signal 113A will decrease to zero over time, while the amplitude of the quadrature-phase signal 123A will increase to become equal to what the in-phase signal originally was. Then, the in-phase signal 113A and the quadrature-phase signal will roll back to their original values. This rolling process may repeat with a frequency proportional to two times the frequency difference between the received signal and the frequency of the local oscillator. The summation of the in-phase and quadrature-phase signals together will allow the maximum amplitude of the output signal 141 to be proportional to the amplitude of the signal 101, even for asynchronous amplitude detection.

Accordingly, the principles of the present invention provide for an amplitude detection circuit with improved dynamic range, without requiring synchronous amplitude detection. The circuits described above also have a small time constant or delay, and have high dynamic range.

The present invention may be embodied in other specific forms without departing from its spirit or essential characteristics. The described embodiments are to be considered in all respects only as illustrative and not restrictive. The scope of the, invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for detecting the amplitude of a baseband electrical signal, the method comprising the following:
    an act of performing full wave rectification of a first portion of the electrical signal around a first offset voltage to generate a first rectified signal, wherein the first portion of the electrical signal is sometimes above the first offset voltage and sometimes below the first offset voltage;
    an act of performing full wave rectification of a second portion of the electrical signal around a second offset voltage to generate a second rectified signal, wherein the second portion of the electrical signal is a quadrature-phase of the electrical signal as compared to the first portion of the electrical signal; and
    an act of generating a signal that is proportional to the sum of the first rectified signal and the second rectified signal.

2. A method in accordance with claim 1, wherein the first portion of the electrical signal comprises substantially all of the electrical signal, wherein the second portion of the electrical signal comprises a signal with an approximately zero amplitude.

3. A method in accordance with claim 1, wherein the act of performing full wave rectification of a second portion of the electrical signal around a second offset voltage comprises the following:
    an act of performing full wave rectification of the second portion of the electrical signal around the first offset voltage.

4. A method in accordance with claim 1, wherein the act of performing full wave rectification of a first portion of the electrical signal around a first offset voltage to generate a first rectified signal comprises the following:
    an act of generating a plurality of control signals;
    an act of supplying the plurality of control signals to a commutative mixer.

5. A method in accordance with claim 4, wherein the act of generating a plurality of control signals comprising the following:
    an act of generating a first control signal that is high when the first portion of the electrical signal is above the first offset voltage, and low when the first portion of the electrical signal is below the first offset voltage; and
    an act of generating a second control signal that is low when the first portion of the electrical signal is above the first offset voltage, and high when the first portion of the electrical signal is below the first offset voltage.

6. A method in accordance with claim 5, wherein the act of generating a first control signal that is high when the first portion of the electrical signal is above the first offset voltage, and low when the first portion of the electrical signal is below the first offset voltage comprises the following:
    an act of amplifying the first portion of the electrical signal using a limiting amplifier;
    an act of providing the amplified signal to a positive terminal of a comparator; and
    an act of providing the first offset voltage to a negative terminal of the comparator.

7. A method in accordance with claim 5, wherein the act of generating a second control signal that is low when the first portion of the electrical signal is above the first offset voltage, and high when the first portion of the electrical signal is below the first offset voltage comprises the following:
    an act of amplifying an inverted version of the first portion of the electrical signal using a limiting amplifier;
    an act of providing the amplified signal to a positive terminal of a comparator; and
    an act of providing the first offset voltage to a negative terminal of the comparator.

8. A method in accordance with claim 5, wherein the act of performing full wave rectification of a first portion of the electrical signal around a first offset voltage to generate a first rectified signal further comprises the following:
    an act of providing the first control signal to a gate terminal of a first nMOS transistor that couples the first portion of the electrical signal to a first terminal of a subtracting amplifier;
    an act of providing the second control signal to a gate terminal of a second nMOS transistor that couples the first portion of the electrical signal to a second terminal of the subtracting amplifier;

an act of providing the first control signal to a gate terminal of a third nMOS transistor that couples an inverted version of the first portion of the electrical signal to the second terminal of the subtracting amplifier; and an act of providing the second control signal to a gate terminal of a fourth nMOS transistor that couples the inverted version of the first portion of the electrical signal to the first terminal of the subtracting amplifier.

9. A method in accordance with claim 8, wherein the first terminal of the subtracting amplifier is a positive terminal of the subtracting amplifier, and wherein the second terminal of the subtracting amplifier is a negative terminal of the subtracting amplifier.

10. A method in accordance with claim 8, wherein the first terminal of the subtracting amplifier is a negative terminal of the subtracting amplifier, and wherein the second terminal of the subtracting amplifier is a positive terminal of the subtracting amplifier.

11. A method in accordance with claim 8, wherein the act of performing fill wave rectification of a first portion of the electrical signal around a first threshold voltage to generate a first rectified signal further comprises the following:

an act of providing an inverted version of the first control signal to a gate terminal of a first pMOS transistor in parallel with the first nMOS transistor that couples the first portion of the electrical signal to the first terminal of a subtracting amplifier;

an act of providing an inverted version of the second control signal to a gate terminal of a second pMOS transistor in parallel with the second NMOS transistor that couples the first portion of the electrical signal the second terminal of the subtracting amplifier;

an act of providing the inverted version of the first control signal to a gate terminal of a third pMOS transistor in parallel with the third nMOS transistor that couples an inverted version of the first portion of the electrical signal to the second terminal of the subtracting amplifier; and an act of providing the inverted version of the second control signal to a gate terminal of a fourth pMOS transistor in parallel with the fourth nMOS transistor that couples the inverted version of the first portion of the electrical signal to the first terminal of the subtracting amplifier.

12. A method in accordance with claim 5, wherein the act of performing full wave rectification of a first portion of the electrical signal around a first threshold voltage to generate a first rectified signal further comprises the following:

an act of providing an inverted version of the first control signal to a gate terminal of a first pMOS transistor that couples the first portion of the electrical signal to the first terminal of a subtracting amplifier;

an act of providing an inverted version of the second control signal to a gate terminal of a second pMOS transistor that couples the first portion of the electrical signal the second terminal of the subtracting amplifier;

an act of providing the inverted version of the first control signal to a gate terminal of a third pMOS transistor that couples an inverted version of the first portion of the electrical signal to the second terminal of the subtracting amplifier; and an act of providing the inverted version of the second control signal to a gate terminal of a fourth pMOS transistor that couples the inverted version of the first portion of the electrical signal to the first terminal of the subtracting amplifier.

13. An amplitude detection circuit that is configured to detect an amplitude of an electrical signal, the circuit comprising the following:

an in-phase full wave rectifier having an input terminal configured to receive an in-phase portion of the electrical signal, perform full wave rectification on the in-phase portion of the electrical signal to generate a first rectified signal, and apply the first rectified signal on an output terminal of the in-phase full wave rectifier, wherein the in-phase full wave rectifier comprises the following:

a waveform sharpener that is configured to generate a plurality of control signals;

a commutative mixer that is configured to receive the plurality of control signals; and a subtraction amplifier, wherein the plurality of control signals are configured to cause the commutative mixer to pass the in-phase portion of the electrical signal to a positive terminal of the subtraction amplifier and configured to pass an inverted version of the in-phase portion of the electrical signal to a negative terminal of the subtraction amplifier when the in-phase portion of the electrical signal is above the threshold voltage, and configured to pass the inverted version of the in-phase portion of the electrical signal to the positive terminal of the subtraction amplifier and configured to pass the in-phase portion of the electrical signal to the negative terminal of the subtraction amplifier when the in-phase portion of the electrical signal is below the threshold voltage.

14. A circuit in accordance with claim 13, wherein the waveform sharpener comprises the following:

a first comparator configured to receive the in-phase portion of the electrical signal, at a positive terminal of the first comparator, and configured to receive the threshold voltage at a negative terminal of the first comparator, the first comparator generating a first control signal; and a second comparator configured to receive the inverted version of the in-phase portion of the electrical signal at a positive terminal of the second comparator, and configured to receive the threshold voltage at a negative terminal of the second comparator, the second comparator generating a second control signal.

15. A circuit in accordance with claim 14, wherein the waveform sharpener further comprises the following:

a limiting amplifier that is configured to amplify the in-phase portion of the electrical signal and the inverted version of the in-phase portion of the electrical signal prior to being provided to the respective first and second comparators.

16. A circuit in accordance with claim 14, wherein the commutative mixer comprises the following:

a first nMOS transistor having a gate terminal coupled to an output terminal of the first comparator, and configured to connect the in-phase portion of the electrical signal to a first terminal of the subtracting amplifier;

a second nMOS transistor having a gate terminal coupled to an output terminal of the second comparator, and configured to connect the in-phase portion of the electrical signal to a second terminal of the subtracting amplifier;

a third nMOS transistor having a gate terminal coupled to the output terminal of the first comparator, and configured to connect the inverted version of the in-phase portion of the electrical signal to the second terminal of the subtracting amplifier; and a fourth nMOS transistor having a gate terminal coupled to the output terminal of the second comparator, and configured to connect the inverted version of the in-phase portion of the electrical signal to the first terminal of the subtracting amplifier.

17. A circuit in accordance with claim 16, wherein the commutative mixer comprises the following:
   a first pMOS transistor in parallel with the first nMOS having a gate terminal that receives an inverted version of the first control signal, and configured to connect the in-phase portion of the electrical signal to the first terminal of the subtracting amplifier;
   a second pMOS transistor in parallel with the second nMOS having a gate terminal that receives an inverted version of the second control signal, and configured to connect the in-phase portion of the electrical signal to the second terminal of the subtracting amplifier;
   a third pMOS transistor in parallel with the third nMOS having a gate terminal that receives an inverted version of the first control signal, and configured to connect the inverted version of the in-phase portion of the electrical signal to the second terminal of the subtracting amplifier; and
   a fourth pMOS transistor in parallel with the fourth nMOS having a gate terminal that receives an inverted version of the second control signal, and configured to connect the inverted version of the in-phase portion of the electrical signal to the first terminal of the subtracting amplifier.

18. A circuit in accordance with claim 17, wherein the first terminal of the subtracting amplifier is a positive terminal of the subtracting amplifier, and wherein the second terminal of the subtracting amplifier is a negative terminal of the subtracting amplifier.

19. A circuit in accordance with claim 17, wherein the first terminal of the subtracting amplifier is a negative terminal of the subtracting amplifier, and wherein the second terminal of the subtracting amplifier is a positive terminal of the subtracting amplifier.

20. An amplitude detection circuit that is configured to detect an amplitude of an electrical signal, the circuit comprising the following:
   an in-phase full wave rectifier having an input terminal configured to receive an in-phase portion of the electrical signal, perform full wave rectification on the in-phase portion of the electrical signal to generate a first rectified signal, and apply the first rectified signal on an output terminal of the in-phase full wave rectifier;
   a quadrature-phase full wave rectifier having an input terminal configured to receive a quadrature-phase portion of the electrical signal, perform full wave rectification on the quadrature-phase portion of the electrical signal to generate a second rectified signal, and apply the second rectified signal on an output terminal of the quadrature-phase full wave rectifier; and
   a signal summer configured to receive signals applied on the output terminal of the in-phase full wave rectifier, receive signals applied on the output terminal of the quadrature-phase full wave rectifier, and generate a signal that is proportional to the sum of the signal applied on the output terminal of the in-phase full wave rectifier and the signal applied on the output terminal of the quadrature-phase fall wave rectifier.

21. A circuit in accordance with claim 20, wherein the in-phase full wave rectifier comprises the following:
   a waveform sharpener that is configured to generate a plurality of control signals;
   a commutative mixer that is configured to receive the plurality of control signals; and
   a subtraction amplifier, wherein the plurality of control signals are configured to cause the commutative mixer to pass the in-phase portion of the electrical signal to a positive terminal of the subtraction amplifier and configured to pass an inverted version of the in-phase portion of the electrical signal to a negative terminal of the subtraction amplifier when the in-phase portion of the electrical signal is above the threshold voltage, and configured to pass the inverted version of the in-phase portion of the electrical signal to the positive terminal of the subtraction amplifier and configured to pass the in-phase portion of the electrical signal to the negative terminal of the subtraction amplifier when the in-phase portion of the electrical signal is below the threshold voltage.

22. A circuit in accordance with claim 21, wherein the waveform sharpener is an in-phase waveform sharpener, the commutating mixer is an in-phase commutating mixer, and the subtracting amplifier is an in-phase subtracting amplifier, wherein the quadrature-phase full wave rectifier comprises the following:
   a quadrature-phase waveform sharpener that is configured to generate a plurality of quadrature-phase control signals;
   a quadrature-phase commutating mixer that is configured to receive the plurality of quadrature-phase control signals; and
   a quadrature-phase subtraction amplifier, wherein the plurality of quadrature-phase control signals are configured to cause the quadrature-phase commutative mixer to pass the quadrature-phase portion of the electrical signal to a positive terminal of the quadrature-phase subtraction amplifier and configured to pass an inverted version of the quadrature-phase portion of the electrical signal to a negative terminal of the quadrature-phase subtraction amplifier when the quadrature-phase portion of the electrical signal is above the threshold voltage, and configured to pass the inverted version of the quadrature-phase portion of the electrical signal to the positive terminal of the quadrature-phase subtraction amplifier and configured to pass the quadrature-phase portion of the electrical signal to the negative terminal of the quadrature-phase subtraction amplifier when the quadrature-phase portion of the electrical signal is below the threshold voltage.

23. A circuit in accordance with claim 20, wherein the quadrature-phase full wave rectifier comprises the following:
   a waveform sharpener that is configured to generate a plurality of control signals;
   a commutative mixer that is configured to receive the plurality of control signals; and
   a subtraction amplifier, wherein the plurality of control signals are configured to cause the commutative mixer to pass the quadrature-phase portion of the electrical signal to a positive terminal of the subtraction amplifier and configured to pass an inverted version of the quadrature-phase portion of the electrical signal to a negative terminal of the subtraction amplifier when the quadrature-phase portion of the electrical signal is above the threshold voltage, and configured to pass the inverted version of the quadrature-phase portion of the electrical signal to the positive terminal of the subtraction amplifier and configured to pass the quadrature-phase portion of the electrical signal to the negative terminal of the subtraction amplifier when the quadrature-phase portion of the electrical signal is below the threshold voltage.

* * * * *

UNITED STATES PATENT AND TRADEMARK OFFICE
CERTIFICATE OF CORRECTION

PATENT NO.   : 6,744,309 B1
DATED        : June 1, 2004
INVENTOR(S)  : Andrei R. Petrov and Craig L. Christensen It is certified that error appears in the above-identified patent and that said Letters Patent is hereby corrected as shown below:

<u>Title page,</u>
Item [57], ABSTRACT,
Line 3, after "signal" insert -- as well --

<u>Column 1,</u>
Line 29, before "often" insert -- is --

<u>Column 2,</u>
Line 17, before "wave" change "fill" to -- full --
Line 24, before "input signal" change "originally" to -- orginal --

<u>Column 3,</u>
Line 8, after "portion of the" insert -- signal; --
Line 33, before "wave" change "fill" to -- full --
Line 38, after "summing the rectified" change "in-phases" to -- in-phase --

<u>Column 4,</u>
Line 33, before "vice versa" change "an" to -- and --

<u>Column 5,</u>
Line 31, before "wave rectifier 200" change "fill" to -- full --

<u>Column 7,</u>
Line 15, after "rectified" change "signal" to -- signals --

Signed and Sealed this

Eighth Day of February, 2005

JON W. DUDAS
*Director of the United States Patent and Trademark Office*